US012585049B2

(12) United States Patent　　(10) Patent No.: US 12,585,049 B2

Zijp et al.　　(45) Date of Patent: Mar. 24, 2026

(54) ACHROMATIC OPTICAL RELAY ARRANGEMENT

(71) Applicant: ASML NETHERLANDS B.V., Veldhoven (NL)

(72) Inventors: Ferry Zijp, Nuenen (NL); Ahmet Burak Cunbul, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 425 days.

(21) Appl. No.: 18/027,415

(22) PCT Filed: Sep. 15, 2021

(86) PCT No.: PCT/EP2021/075268

§ 371 (c)(1),
(2) Date: Mar. 21, 2023

(87) PCT Pub. No.: WO2022/069218

PCT Pub. Date: Apr. 7, 2022

(65) Prior Publication Data

US 2023/0333290 A1　　Oct. 19, 2023

(30) Foreign Application Priority Data

Oct. 1, 2020　(EP) ..................................... 20199589

(51) Int. Cl.
G02B 5/00　　(2006.01)
G02B 3/04　　(2006.01)
(Continued)

(52) U.S. Cl.
CPC ............... G02B 5/001 (2013.01); G02B 3/04 (2013.01); G02B 13/0095 (2013.01); G03F 7/706845 (2023.05); G03F 7/706849 (2023.05)

(58) Field of Classification Search
CPC ............... G02B 5/001; G03F 7/706849; G03F 7/706845
See application file for complete search history.

(56) References Cited

U.S. PATENT DOCUMENTS 6,952,253 B2　10/2005　Lof et al.
6,961,116 B2　11/2005　Den Boef et al.
(Continued)

FOREIGN PATENT DOCUMENTS

CN　　108427203　　8/2018
EP　　1628164　　2/2006
(Continued)

OTHER PUBLICATIONS

International Search Report and Written Opinion issued in corresponding International Application No. PCT/EP2021/075268, dated Apr. 7, 2022.

(Continued)

*Primary Examiner* — Lucy P Chien

(74) *Attorney, Agent, or Firm* — Pillsbury Winthrop Shaw Pittman, LLP

(57) ABSTRACT

A lens system including: a first asphercal axicon lens element having a first refractive surface and a second refractive surface; a second aspherical axicon lens element having a third refractive surface similar to the second refractive surface and a fourth refractive surface similar to the first refractive surface, and an aperture stop located between the first asphercal axicon lens element and the second aspherical axicon lens element. The first aspherical axicon lens element and second aspherical axicon lens are mutually oriented such that the second refractive surface and third refractive surface are mutually facing. The first aspherical axicon lens element and the second aspherical axicon lens element are (Continued)

configured to minimize chromatic aberration for at least a spectral range of radiation relayed by the lens system.

20 Claims, 6 Drawing Sheets

(51) Int. Cl.
   *G02B 13/00*     (2006.01)
   *G03F 7/00*      (2006.01)

(56) References Cited

U.S. PATENT DOCUMENTS

| | | | |
|---|---|---|---|
| 7,265,364 | B2 | 9/2007 | Teunissen et al. |
| 7,646,471 | B2 | 1/2010 | Teunissen et al. |
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 2007/0183292 | A1 | 8/2007 | Ujiie et al. |
| 2010/0233600 | A1 | 9/2010 | Den Boef et al. |
| 2010/0302396 | A1 | 12/2010 | Golub et al. |
| 2010/0328655 | A1 | 12/2010 | Den Boef |
| 2011/0026032 | A1 | 2/2011 | Den Boef et al. |
| 2011/0102753 | A1 | 5/2011 | Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2015/0261097 | A1 | 9/2015 | Mathijssen et al. |
| 2016/0069997 | A1* | 3/2016 | Johnson ................. G01S 17/06 356/614 |
| 2016/0161863 | A1 | 6/2016 | Den Boef et al. |
| 2016/0246189 | A1* | 8/2016 | Van Berkel .......... G01N 21/956 |
| 2016/0370717 | A1 | 12/2016 | Den Boef et al. |
| 2016/0377411 | A1* | 12/2016 | Gross ................. G01B 11/0608 356/630 |
| 2020/0201006 | A1* | 6/2020 | Hu .......................... G02B 15/15 |
| 2020/0276667 | A1 | 9/2020 | Filkins et al. |
| 2021/0134868 | A1* | 5/2021 | Tsujio ..................... G02B 3/00 |
| 2022/0261072 | A1* | 8/2022 | Altal .................... G02B 26/004 |

FOREIGN PATENT DOCUMENTS

| | | |
|---|---|---|
| JP | 2007213709 | 8/2007 |
| JP | 2017142277 | 8/2017 |
| WO | 2011/012624 | 2/2011 |
| WO | 2016/102127 | 6/2016 |

OTHER PUBLICATIONS

G. Schulz, "Achromatic and sharp real imaging of a point by a single aspheric lens", Appl. Opt., 22, 20, pp. 3242-3248 (1983).
AARJ. Bagwell et al., "An Achromatic Singlet", Proc. of SPIE, vol. 11261 (Feb. 2020).

* cited by examiner (a)

(b)

ACHROMATIC OPTICAL RELAY ARRANGEMENT

CROSS-REFERENCE TO RELATED APPLICATIONS

This application is the U.S. national phase entry of PCT Patent Application No. PCT/EP2021/075268 which was filed on September 15, 2021, which claims priority of European Patent Application No. 20199589.1 which was filed on Oct. 1, 2020 and which is incorporated herein in its entirety by reference.

FIELD

The present invention relates to an achromatic optical relay arrangement, and in particular such an optical relay arrangement in relation to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as alignment tools for proper positioning of a substrate prior to an exposure, leveling tools to measure a surface topology of the substrate, for e.g., focus control and scatterometry based tools for inspecting/measuring the exposed and/or etched product in process control. In each case, a radiation source is required. For various reasons, including measurement robustness and accuracy, broadband or white light radiation sources are increasingly used for such metrology applications. However, in contrast to the case of narrow-band radiation, propagation of broadband radiation typically has higher requirements for (reflective and transmissive) optical elements that are used in the beam path of broadband radiation. For example, where optical lenses are used to shape (e.g., focusing or collimating) the beam of broadband radiation, the lenses are required to cause low or negligible chromatic aberration to the beam of broadband radiation e.g., in order to obtain a small focused spot or well collimated beam. Although low chromatic aberration lenses have been proposed and developed, their performance is still limited. Hence, it would be desirable to improve on present optical lenses for better beam shaping of broadband radiation.

SUMMARY

In a first aspect of the invention there is provided a lens system, comprising: a first aspherical axicon lens element comprising a first refractive surface and a second refractive surface; a second aspherical axicon lens element comprising a third refractive surface similar to said second refractive surface and a fourth refractive surface similar to said first refractive surface, said first aspherical axicon lens element and second aspherical axicon lens being mutually oriented such that second refractive surface and said third refractive surface are mutually facing; and an aperture stop located between the first aspherical axicon lens element and the second aspherical axicon lens element; wherein the first aspherical axicon lens element and the second aspherical axicon lens element are configured to minimize chromatic aberration for at least a spectral range of radiation relayed by the lens system.

Other aspects of the invention comprise metrology device comprising the broadband light source device of the first aspect

BRIEF DESCRIPTION OF THE DRAWINGS

Embodiments of the invention will now be described, by way of example only, with reference to the accompanying schematic drawings, in which:

FIG. 8(*b*) depicts schematically an achromatic singlet collimation lens;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
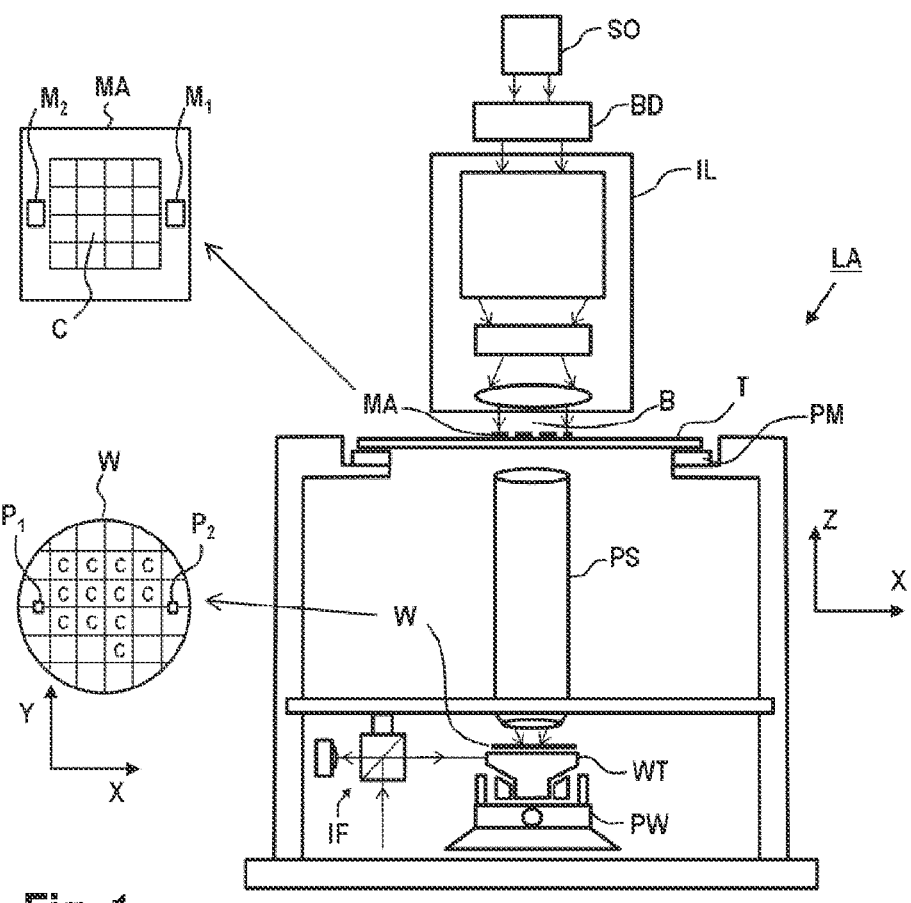
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
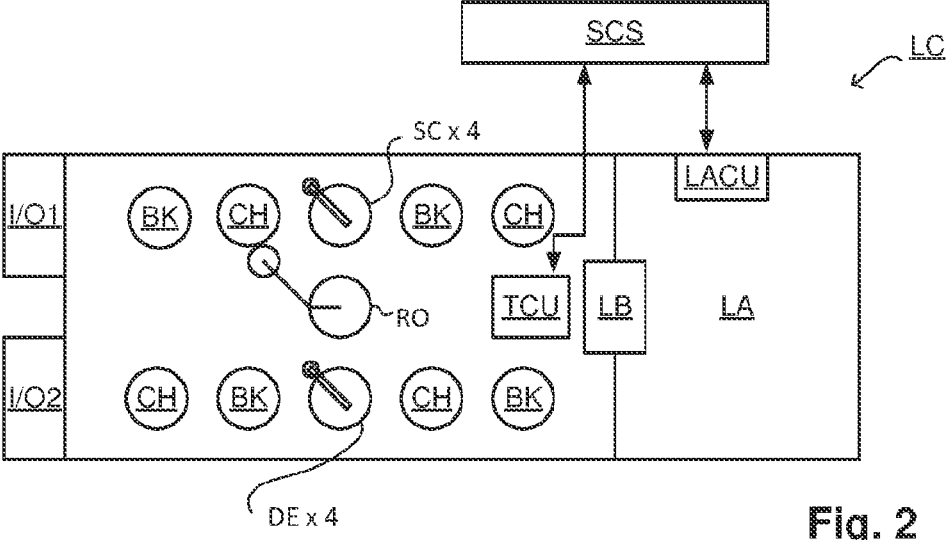
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
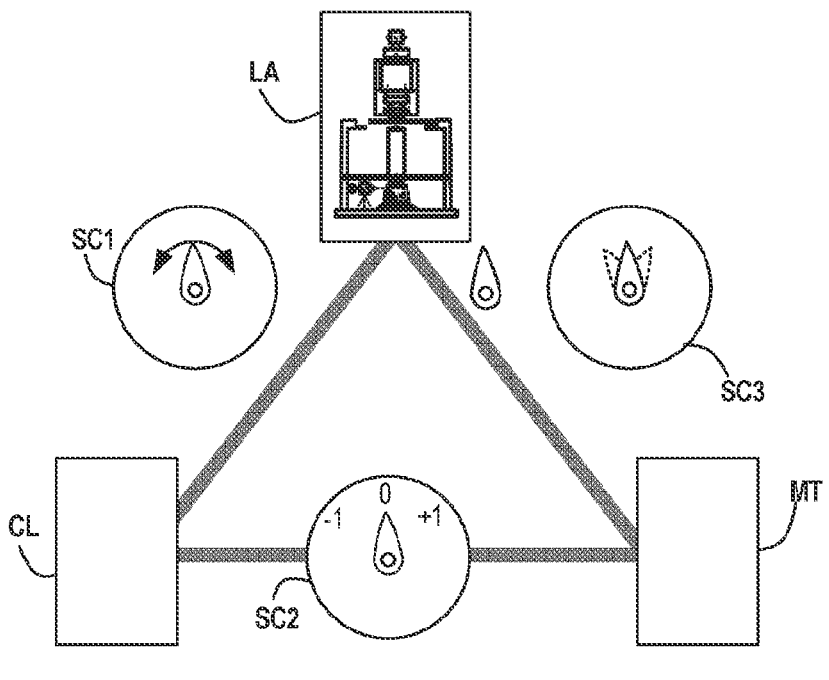
FIG. 3 depicts a schematic representation of holistic lithography, representing a cooperation between three key technologies to optimize semiconductor manufacturing.

Typically, the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1).

Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers) and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically, the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resemble the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 4:
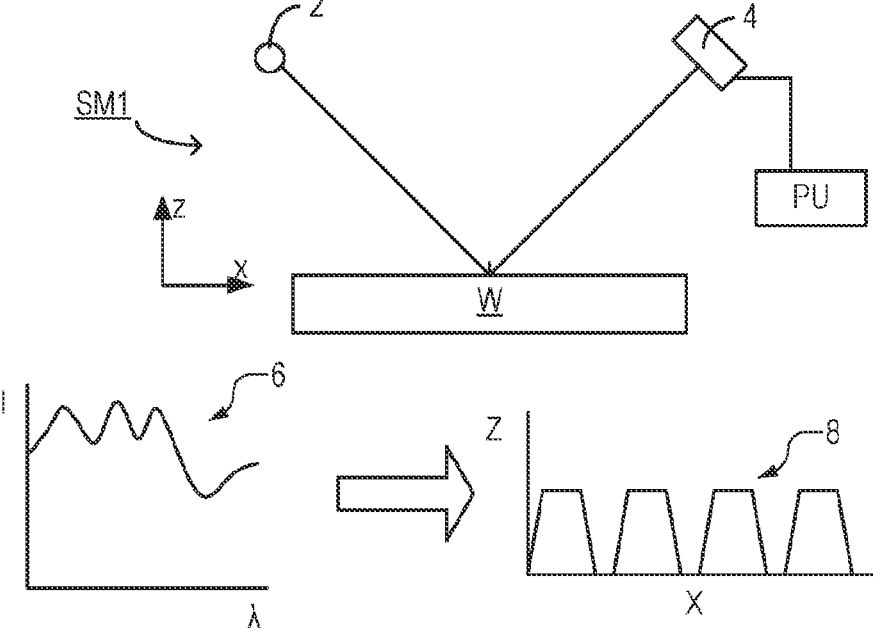
FIG. 4 depicts a schematic overview of a scatterometry apparatus used as a metrology device, which may comprise a radiation source according to embodiments of the invention.

A metrology apparatus, such as a scatterometer, is depicted in FIG. 4. It comprises a broadband (white light) radiation projector 2 which projects radiation onto a substrate 6. The reflected or scattered radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known, and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016/0161863 and published US patent application US 2016/0370717A1 incorporated herein by reference in its entirety.

Another type of metrology tool used in IC manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
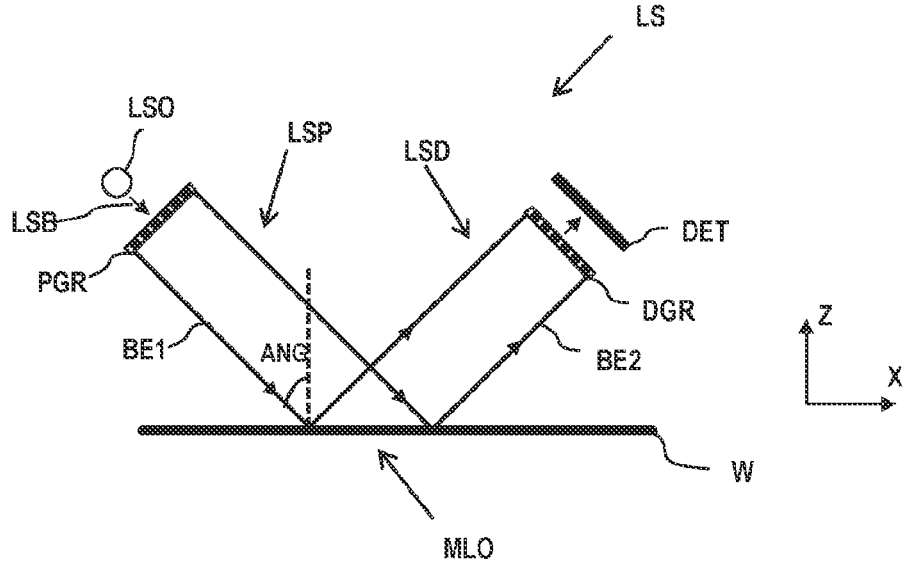
FIG. 5 depicts a schematic overview of a level sensor apparatus which may comprise a radiation source according to embodiments of the invention.

An example of a level or height sensor LS as known in the art is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband light source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Another type of metrology tool used in IC manufacture is an alignment sensor. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all these publications are incorporated herein by reference.

Figure 6:
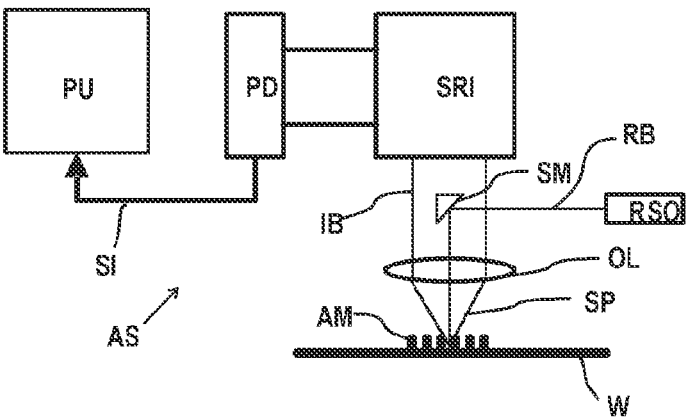
FIG. 6 depicts a schematic overview of an alignment sensor apparatus which may comprise a radiation source according to embodiments of the invention.

FIG. 6 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the alignment mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

Metrology tools MT, such as a scatterometer, topography measurement system, or position measurement system mentioned above may use radiation originating from a radiation source to perform a measurement. The properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a metrology target with no or minimal interference with other frequencies. Therefore, different frequencies may for example be used to obtain more metrology data simultaneously. Different radiation frequencies may also be able to interrogate and discover different properties of a metrology target. Broadband radiation may be useful in metrology systems MT such as for example level sensors, alignment mark measurement systems, scatterometry tools, or inspection tools. A broadband radiation source may be a supercontinuum source.

High quality broadband radiation, for example supercontinuum radiation, may be difficult to generate. One method for generating broadband radiation may be to broaden high-power narrow band or single frequency input radiation, for example making use of non-linear, higher order effects. The input radiation (which may be produced using a laser) may be referred to as pump radiation. Alternatively, the input radiation may be referred to as seed radiation. To obtain high power radiation for broadening effects, radiation may be confined into a small area so that strongly localized high intensity radiation is achieved. In those areas, the radiation may interact with broadening structures and/or materials forming a non-linear medium so as to create broadband output radiation. In the high intensity radiation areas, different materials and/or structures may be used to enable and/or improve radiation broadening by providing a suitable non-linear medium.

In some implementations, the broadband output radiation is created in a photonic crystal fiber (PCF). Such a photonic crystal fiber has microstructures around its fiber core assisting in confining radiation that travels through the fiber in the fiber core. The fiber core may be a hollow core filled with a gas medium, or it can be made of a solid material. Both the solid and gas-filled hollow fiber cores have non-linear properties and are capable of generating broadband radiation when high intensity pump radiation is transmitted through the fiber core. Upon generation, optical relay systems are often required to transfer and/or modify the broadband radiation. Optical relay systems are used in many optical apparatuses e.g., to create additional conjugated planes and to transfer optical energy in the apparatus. In each conjugate plane, one or more characteristics of the optical beam propagating through the optical relay system can be modified by one or more optical elements placed in that plane.

Figure 7:
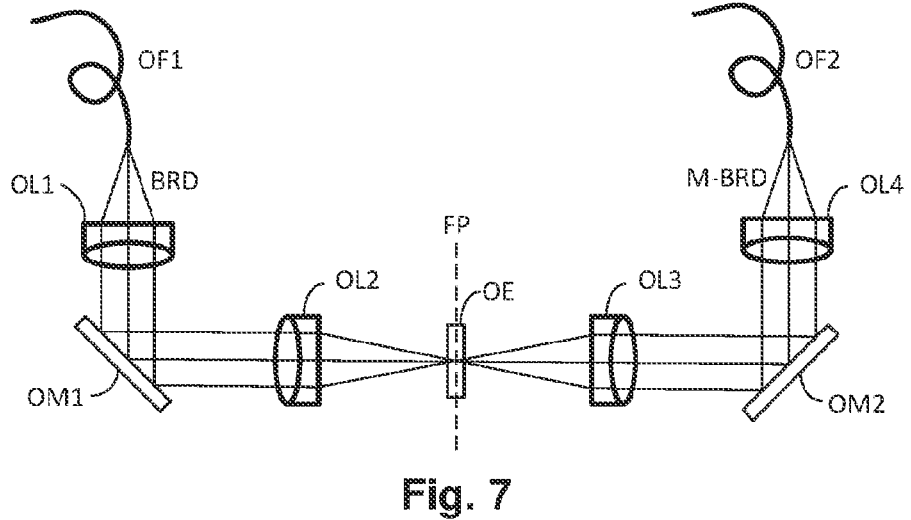
FIG. 7 depicts schematically a prior art optical relay system for transferring and modifying broadband radiation.

FIG. 7 shows a schematic overview of a purely exemplary prior art optical relay system for transferring and modifying broadband radiation. The example optical relay system is used to transfer broadband radiation from a first optical fiber OF to a second optical fiber OF2. The optical relay system comprises first pair of optical lenses of first lens system OL1, OL2 a second pair of optical lenses or second lens system OL3, OL4, first and second reflecting mirrors OM1, OM2 and one or more optical elements (e.g., optical filters) OE. Each pair of optical lenses OL1, OL2; OL3, OL4 functions as a lens system or sub-optical relay system and together they produce an image of the end facet of the first fiber.

The broadband radiation BRD emitting from the first optical fiber OF is collimated by a first optical lens OL1 of the first lens system. The collimated beam of broadband radiation BRD is guided by a first optical mirror OM1 before being focused by a second optical lens OL2 of the first lens system. The focal plane FP formed after the second optical lens OL2 is a conjugate plane of a plane defined by the output end facet of the first optical fiber OF (e.g., an input plane or object plane). At the focal plane FP of the first lens system OL1, OL2, one or more optical elements OE (e.g., optical filters and/or apertures) may be placed to modify the characteristics (e.g., spectrum and/or beam size) of the broadband radiation BRD. The modified broadband radiation M-BRD is then collimated by a first optical lens OL3 of the second lens system before being guided by a second optical mirror OM2. Finally, the modified broadband radiation M-BRD is focused or coupled into a second optical fiber OF2 via a second optical lens OL4 of the second lens system. In a similar manner, the focus plane FP is re-imaged by the second pair of optical lenses OL3 and OL4 onto a plane defined by the input end facet of the second optical fiber OF2 (e.g., output plane or image plane). In this manner, the optical relay system transfers the broadband radiation BRD from one fiber to another fiber while simultaneously allowing characteristics of the broadband radiation BRD to be modified in a desired manner. Typically, additional optical elements OE may also be placed in-between the first pair of optical lenses OL1 and OL2, and/or between the second pair of optical lenses OL3 and OL4 for purposes like optical diagnosis and optical attenuation.

In a perfect situation where no aberration is present in the optical relay system, a small and undistorted focus would be generated at the focal plane FP. In other words, all the wavelengths of the broadband radiation are focused onto the same focal plane FP. The diameter of the focus in the focal plane is thus the product of the core diameter of the first fiber and a magnification factor determined by the first lens system OL1 and OL2. In a similar manner, the second lens system OL3 and OL4 images all wavelengths with or without modification onto the same output plane.

However, in the optical lenses OL1 to OL4 are conventional single lens elements (also known as a 'singlet' lens), a significant amount of chromatic aberration will be generated resulting in serious optical beam distortion or chromatic focusing. This is due to the fact that conventional singlet lenses (e.g., spherical lenses or aspherical lenses) are not achromatic. Chromatic focusing results from chromatic dispersion of a lens or lens assembly and leads to a wavelength dependent focal length. Such a wavelength dependent focal length in turn results in a distorted focus which spreads considerably along the optical axis of the lens or lens assembly. Referring back to FIG. 7, if focus is distorted along the optical axis of the system due to chromatic aberration, different wavelengths will be focused onto different focal planes which may not overlap with the nominal focal plane FP. Correspondingly, after being reimaged by the second pair of optical lenses OL3 and OL4, the conjugate planes of those wavelength dependent focal planes may not overlap with the output plane defined by the end facet of the second optical fiber. This results in a significant power/ energy loss and a distorted spectrum as some wavelengths may not be properly coupled into the fiber core, e.g., due to unacceptable divergence.

To mitigate the chromatic focusing issue, achromatic lenses have been developed and used for beam shaping of broadband radiation. An achromatic lens often consists of two or more single lens elements. For example, an achromatic lens comprising two single lens elements is called a doublet lens (or simply doublet) whereas an achromatic lens comprising three single lens elements is called a triplet lens (or simply triplet). Each single lens element has an optical input or entrance surface and an optical output or exit surface, which may be spherical, aspherical or flat. An achromatic doublet lens typically comprises a negative lens comprising a glass with high dispersion and a positive lens comprising a glass with low dispersion. Depending on application, two single lens elements of an achromatic doublet lens can be either cemented together e.g., by means of adhesives; or they can be held together mechanically e.g., by means of a lens frame, such that a narrow air gap is formed between two facing surfaces of the two respective lens elements. Air-spaced doublet lenses may be preferred where thermal expansion differences between the two single lens elements prohibit cementing. When such two elements are carefully assembled together (e.g., cemented together), the resultant achromatic doublet lens may be capable of achieving an identical back focal length for two different wavelengths, with some residual chromatic aberration for the other wavelengths. This residual chromatic aberration is much smaller than that achievable with a conventional singlet lens.

The overall transmission efficiency of the optical relay system may be significantly improved when using achromatic doublet lenses (e.g., in place of some or all of optical lenses OL1, OL2, OL3, OL4) as compared to that obtained using conventional single lenses, due to reduced chromatic aberration. The achromatic doublet lenses may be optimized by carefully designing and matching two single lens elements such that the dispersion of one lens element substantially cancels that of the other lens element in a given wavelength range. Their aberration correction capability, however, degrades sharply at wavelengths outside the given wavelength range. Therefore, for broadband applications, the wavelength range within which the optical relay system of FIG. 7 performs desirably is predominantly governed by the wavelength range in which the achromatic doublet lenses (e.g., lenses OL1 to OL4) substantially maintain a high degree of chromatic aberration correction.

Although achromatic doublet lenses are capable of reducing or minimizing chromatic aberration of an optical relay system, they have many limitations. Firstly, achromatic doublet lenses are optimized by balancing the negative and positive dispersion of the two single lens elements at a particular wavelength within a desired wavelength range, for example the middle wavelength of the range. As such, the relationship between chromatic aberration and the wavelength follows a nonlinear curve, e.g., a U-shaped curve. This means that chromatic aberration at either end of the wavelength range is significantly higher than at the optimization wavelength, thereby unsuitable or acceptable for many applications where a flatter aberration-wavelength curve is desired. For example, when used in an optical relay system for transferring an octave-spanning coherent supercontinuum, it is desirable to use achromatic lenses which are capable of maintaining a substantially flat and low chromatic aberration across the entire spectrum of the supercontinuum. At present, such a requirement cannot be met by existing achromatic doublet lenses or triplet lenses without incurring a substantial additional cost.

Secondly, in cemented achromatic doublets, the adhesives used to bond the two single lens elements together are sensitive to ambient environment. Generally, cemented doublets are not suitable for applications where optical components are required to withstand high temperatures or high dose of blue or violet light. This is because a high ambient temperature could soften the hardened adhesive used to cement the single lens elements; whereas strong absorption of blue or violet light could break down the chemical bonds in the hardened adhesive. In both cases, this may result in poor lifetime of an achromatic doublet. Unexpected failure of an achromatic doublet (e.g., de-bonding of the single lens elements) can be detrimental to an optical system as the failed achromatic doublet could deviate a laser beam propagating within the system from a desired beam path and thus result in component damage or safety concerns.

The aforementioned environment-sensitive problem can be mitigated by using air-spaced doublets. Rather than using an adhesive to combine two single lens elements together, air-spaced doublet lenses fix the two single lens elements in position using mechanical means, e.g., a mechanical frame. However, one or the functions of the adhesive is to substantially index-match the two combining lens elements and without this index-matching, the two internal lens surfaces give rise to additional transmission loss. Even with a suitable anti-reflective (AR) coating, the two internal surfaces still reduce optical transmission by at least a few percent in particular for very broadband applications. Where multiple doublet lenses are used in the beam path, or there are multiple passes through the same doublet lens, the accumulated transmission loss can be significant. Moreover, it is common to have highly spherical surfaces on the inner surfaces of an air spaced achromat when aplanatic imaging is required; in such situations AR coatings may generate nonlinear apodization effects (e.g., perturbations to a Gaussian/top hat beam).

In the scientific publication "*Achromatic and sharp real imaging of a point by a single aspheric lens*", Applied Optics, Volume 22, Issue 20, Pages 3242-3248, 1983, (which is incorporated herein by reference) Gunter Schulz describes a design method by which achromatism can be achieved in a singlet lens with an unconventional shape. However, the design method is not widely known and used. The singlet lenses designed according to Schulz's design method are essentially "aspherical" axicons, where the lens surfaces are nonlinear functions of the radius. Such aspherical axicon lenses (e.g., achromatic aspherical axicon singlet lens elements designed according to Schulz's design method) are able to achieve a remarkably high degree of chromatic aberration correction for the cost of an axial hole in the pencil of transmitted rays (the equivalent of an extreme form of pupil distortion).

According to the basic design principle described in Schulz and may be used for designing the achromatic aspherical axicon lenses described herein, each refractive surface of an aspherical axicon singlet is broken down to a plurality of discrete surface elements. Since one element of either surface determines directly two elements of the other surface, each surface element can be individually and successively determined using y-n-u raytracing, wherein y represents height, n represents refractive index and u represents ray angle, all defined at various surface elements along the optical axis. Such mutual determination of surface elements results from the law of refraction and the requirement of constant optical path length for a specific wavelength or a corresponding refractive index value at such a wavelength. More specifically, in Schulz's design method, two refracting surfaces of an aspherical axicon singlet are constructed by following three main steps.

Step one: if an object point, an image point and two refractive-index values (for two different wavelengths) are given and if the corresponding two optical path lengths and one surface element are known, then all the other discrete surface elements can be successively determined using y-n-u raytracing.

Step two: intermediate surface elements between any two surface elements determined at step one can be obtained by means of interpolation (e.g., third order polynomial). Subsequently total lens surfaces are determined by connecting up all the surface elements including surface elements determined at step one and step two.

Step three: surface optimization is applied to ensure the optical path lengths corresponding to the two reflective-index values are properly balanced and/or to ensure surface normal and curvatures of the refracting surfaces are continuous everywhere other than for the axial point.

Figure 8:
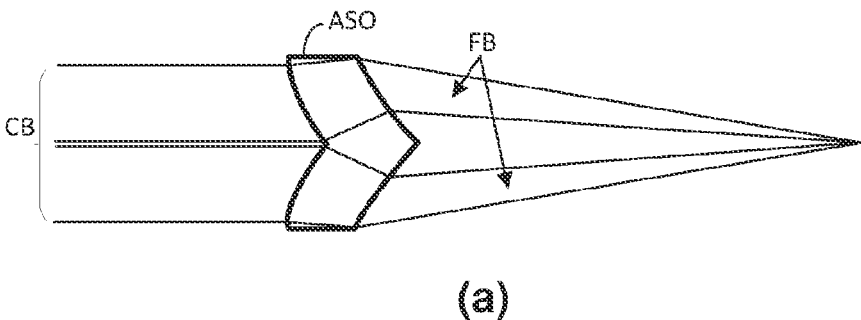
FIG. 8(*a*) depicts schematically an achromatic singlet focusing lens.
Figure 8:
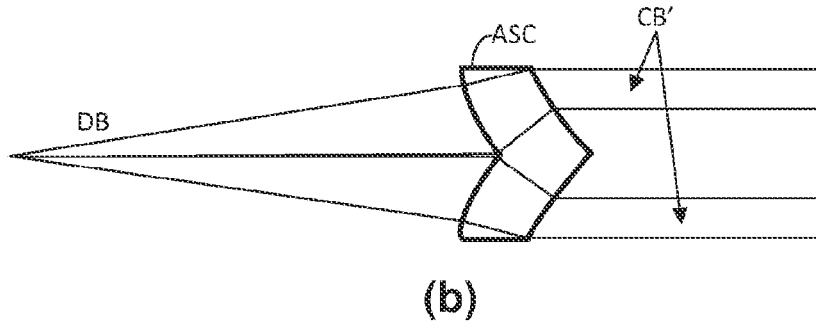

FIGS. 8(*a*) and 8(*b*) respectively illustrate an achromatic aspherical axicon singlet objective lens ASO and an achromatic aspherical axicon singlet collimator lens ASC, both designed to operate according to the conditions defined in Schulz's design method. With reference to FIG. 8(*a*), the achromatic aspherical axicon singlet objective lens receives a continuous beam of collimated light CB at the clear aperture of the lens and focuses this light essentially free of chromatic aberration into a converging or focused beam FB with a central hole. With reference to FIG. 8(*b*), the achromatic aspherical axicon singlet collimator lens receives a continuous beam of diverging light DB at the clear aperture of the lens and collimates this light essentially free of chromatic aberration into a parallel or collimated beam CB' with a central hole. Both achromatic aspherical axicon singlet lens elements may be designed for a glass or a polymer with d-line ($\lambda$=587.56 nm) refractive index $n_d$=1.5312 and Abbe number $V_d$=56.044.

Figure 9:
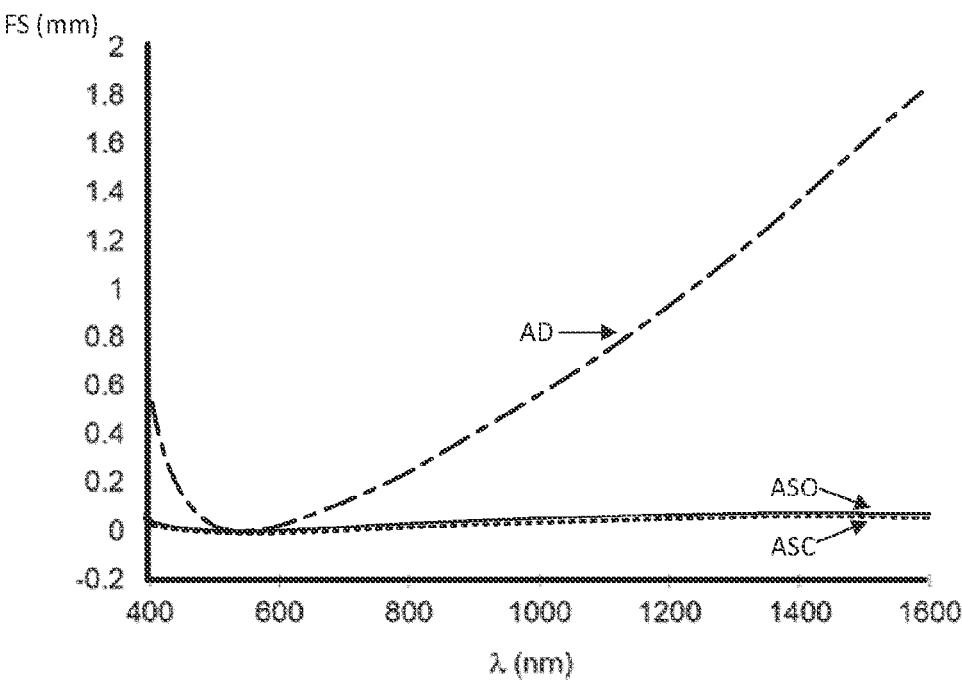
FIG. 9 compares the calculated chromatic focal shift of the achromatic singlets as depicted in FIGS. 8(*a*) and 8(*b*) with a commercial achromatic doublet of the same back focal length and numerical aperture.

FIG. 9 is a plot of chromatic focal shift FS against wavelength $\lambda$ which compares the chromatic behavior of the achromatic aspherical axicon singlet lens elements ASO, ASC to a known achromatic doublet lens AD of the same back focal length and numerical aperture. The figure illustrates the simulated chromatic aberration as a shift of the back focal length (also known as 'axial color') relative to the focal length at a wavelength of 550 nanometer (nm). The achromatic aspherical axicon singlet lens elements (aspherical axicon collimator ASC and aspherical axicon objective ASO) have significantly lower chromatic aberration than the achromatic doublet lens AD. By contrast, the chromatic focal shift of the doublet lens has a nonlinear (U-shaped curve) relationship with the wavelength and can only match the chromatic focal shift of the achromatic singlets in a significantly narrower wavelength range, e.g., a range of less than 100 nm. In fact, for the achromatic aspherical axicon singlets, the chromatic focal shift is negligible, thereby resulting in smaller than diffraction-limited root-mean-square (RMS) spot radius (also known as 'Airy disc radius') over a wavelength range of 420 nm to beyond 1.4 micrometers ($\mu$m), without any refocusing.

As such, an achromatic lens system in the context of this disclosure may comprise having a chromatic focal shift which varies by no more than 1 mm, 0.5 mm, 0.3 mm, 0.2 mm, 0.15 mm or 0.1 mm over a given spectral range or spectral range of interest. In each case the spectral range of interest may be a range spanning more than 400 nm, more than 600 nm, more than 800 nm, more than 1000 nm, more than 1200 nm or more than 1500 nm. Any of these spectral range spans may be centered on any wavelength between 600 nm and 1400 nm for example.

Note that the achromatic doublet AD in FIG. 9 is designed to operate in the visible wavelength range, i.e., approximately between 400 nm and 700 nm, so it is to be expected that the doublet lens does not perform well at long wavelengths. Nevertheless, the performance-matched range (e.g., less than 100 nm) within which the commercial achromatic doublet performs similarly to the achromatic singlets is only a third of the specified wavelength range (e.g., between 400 nm and 700 nm). At present, there are no doublets that have a chromatic behavior that comes close to that of the achromatic singlets over such a wide spectral range.

Although achromatic aspherical axicon singlet lens elements (e.g., designed according to Schulz's design method) have unmatched chromatic aberration correction performance, they are however not widely used. There may be a number of reasons why such aspherical axicon singlet lenses were not widely adopted. First, the concave lens surface of an achromatic aspherical axicon lens cannot be manufactured by conventional polishing. This problem may be overcome, for example, by using other alternative manufacturing methods, such as diamond turning, polymer injection molding and high precision glass molding. However, these alternative manufacturing methods have their own limitations and often result in high manufacturing costs. For example, diamond turning is generally restricted to certain materials (e.g., infrared optical components) and thus might not be applicable for manufacturing achromatic aspherical axicon singlet lens elements made of an unsuitable glass. Secondly, the achromatic aspherical axicon lenses have extremely poor (or high) off-axis aberrations, they are only well-corrected for imaging an on-axis point. Studies have been carried out to compare the on-axis and off-axis aberrations of achromatic aspherical axicon singlet lens elements, e.g., the achromatic singlet objective lens in FIG. 8(a). It is found that an on-axis point can be focused essentially free of aberrations while an off-axis point suffers from very strong asymmetric aberrations making such lenses completely impractical for imaging points that are even slightly off-axis. This behavior strongly limits the practical use of such achromatic singlet designs. Because of the poor off-axis aberrations, when two or more of such lenses are used in an optical relay system, they should be aligned with extremely small tolerances. Consequently, the optical relay system will be extremely sensitive to the operating environment, e.g., vibrations, temperatures.

Figure 10:
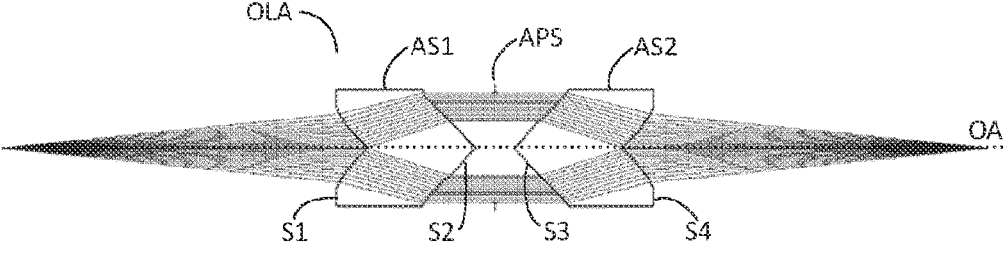
FIG. 10 depicts schematically an achromatic lens system comprising two separate achromatic aspherical axicon singlet lens elements in accordance with an embodiment.

Therefore, it is desirable to have an alternative lens arrangement or lens system which address some or all of the aforementioned problems. FIG. 10 depicts schematically an achromatic optical relay arrangement or lens system comprising two separate aspherical axicon lens elements, such as achromatic aspherical axicon lens elements or achromatic aspherical axicon singlet lens elements in accordance with an embodiment. In this embodiment, the two achromatic aspherical axicon singlet lens elements AS1, AS2 may be similar (i.e., identical or near identical) and positioned in series in a mirrored or mutually facing arrangement; such that the two facing inner refractive surfaces S2, S3 comprise a first pair of similar refractive surfaces and the input and output refractive surfaces S1, S4 of the lens system comprise a second pair of similar refractive surfaces. An aperture stop APS may be placed in the optical relay arrangement OLA, e.g., equidistant from the two achromatic aspherical axicon singlet lens elements AS1, AS2. The aperture stop may be an opening which limits the amount of light passing through an optical system. As such, the optical relay arrangement OLA may have a substantially perfect symmetry about the aperture stop. Comparing to other different arrangements, the symmetric arrangement may have an advantage of causing all field-dependent aberrations of odd order from the first achromatic aspherical axicon singlet lens element AS1 to be cancelled by the second achromatic aspherical axicon singlet lens element AS2, thereby significantly reducing the aberrations of the optical relay arrangement OLA. Note that, since the optical relay arrangement OLA, comprising the first achromatic aspherical axicon singlet lens element AS1, the second achromatic aspherical axicon singlet lens element AS2 and the aperture stop APS, may have rotational symmetry about the optical axis, for the sake of simplicity, FIG. 10 only shows the optical relay arrangement OLA in a (e.g., vertical) meridional plane.

Each of the two achromatic aspherical axicon singlet lens elements may comprise two refractive surfaces, e.g., first and second refractive surfaces S1, S2 and third and fourth refractive surfaces S3, S4. The corresponding refractive surfaces (S1 corresponding to S4, S2 corresponding to S3) of the two achromatic aspherical axicon singlet lens elements may be identical or substantially the same. For each achromatic aspherical axicon singlet lens element, its two refractive surfaces may be constructed using the aforementioned Schulz's design method such that at least on-axis aberration is well corrected. However any suitable achromatic aspherical axicon singlet lens elements may be used to form a lens system as disclosed herein, for example, any suitable aspherical axicon lenses.

Depending on application requirements, e.g., spectral range of light, the achromatic aspherical axicon singlet lens elements may be made of any suitable glass or polymer and may be manufactured by a standard manufacturing method, e.g., diamond turning, polymer injection molding or high precision glass molding. For example, when the optical relay arrangement OLA is used to transfer broadband radiation where a considerable portion of the spectrum lies in the infrared (IR) region (e.g., between 1 µm and 6 µm), the two achromatic aspherical axicon singlet lens elements may be made of Calcium Fluoride ($CaF_2$) which possesses excellent properties in the IR region (e.g., high transmission to IR radiation). Since $CaF_2$ is one of the materials that are readily machinable by diamond turning, the achromatic aspherical axicon singlet lens elements can thus be manufactured using high precision diamond turning.

In some embodiments, the two achromatic aspherical axicon singlet lens elements AS1, AS2 and the aperture stop APS may be assembled together by means of for example a lens alignment arrangement or a lens tube. The lens tube may be machined such that it holds one of the two achromatic aspherical axicon singlet lens elements at each end of the tube, e.g., using retaining rings or set-screws. The aperture stop APS may be located within the tube and may have an equal distance to the two achromatic aspherical axicon singlet lens elements AS1, AS2. The aperture stop APS may be an integral part of the lens tube. Alternatively, the aperture stop APS may be a part separable to the lens tube and may be placed into the lens tube and fixed in position before the lenses are assembled. The aperture stop APS may have an annular shape of which the inner diameter may be optimized according to lens designs. In different embodiments, the aperture stop APS may have an adjustable aperture diameter which may be adjusted during operation. Referring back to FIG. 10, since the light beam between the refractive surface S2 and the refractive surface S3 is substantially collimated, the tube length or the separation distance between the two lenses may be less critical and thus can be flexibly chosen.

The achromatic aspherical axicon singlet lens elements AS1, AS2 may be designed to provide any NA and focal length which are available using conventional singlet lenses (e.g., optical spherical lenses). The achromatic aspherical axicon singlet lens elements AS1, AS2 may be designed and manufactured to have similar physical dimensions (e.g., diameter, thickness), and/or similar manufacturing tolerances (e.g., surface quality, Abbe number).

In some embodiments, the first achromatic aspherical axicon singlet lens element AS1, the second achromatic aspherical axicon singlet lens element AS2 and the aperture stop APS may be respectively mounted e.g., on three independent optomechanical mounts. Since the performance of achromatic aspherical axicon singlets can be very sensitive to any off-axis deviation (e.g., decentering or tilting with respect to the optical axis OA), separate mounting of the three optical components may allow more degrees of freedom for optimizing optical alignment of the optical relay arrangement and thus minimize alignment induced performance degradation. Such an arrangement may be used in combination with an active alignment system, e.g., an adaptive system comprising kinematic mounts (e.g., having a tip/tilt function) in combination with a feedback loop.

In comparison to an optical relay system where achromatic doublet lenses are used (e.g., the example system in FIG. 7), the optical relay arrangement comprising two identical achromatic aspherical axicon singlet lens elements arranged symmetrically about an aperture stop is able to address the problems inherent in cemented doublets, e.g., shorter lifetime when subject to high temperatures and strong blue or violet light, and air-spaced doublets, e.g., additional transmission loss caused by internal surfaces. In addition, replacing achromatic doublet lenses with achromatic aspherical axicon singlet lens elements such as achromatic aspherical axicon singlets can further reduce chromatic aberration and significantly extend the spectral range within which chromatic aberration is well corrected. It should be appreciated that other achromatic aspherical axicon singlet lens elements designed according to different methods other than Schulz's design method may not be as sensitive to off-axis deviations as achromatic aspherical axicon singlets. Therefore, those lenses may not require as tight alignment tolerances.

An optical relay arrangement or lens system comprising two achromatic aspherical axicon singlets may have tight alignment tolerances due to their high sensitivity to off-axis deviations. Therefore, in an embodiment, the lens system may comprise a monolithic optical component; i.e., the two lenses AS1, AS2 may be formed as a single monolithic element joined by a joining section with sufficiently small diameter so as not to impede the radiation being relayed.

Figure 11:
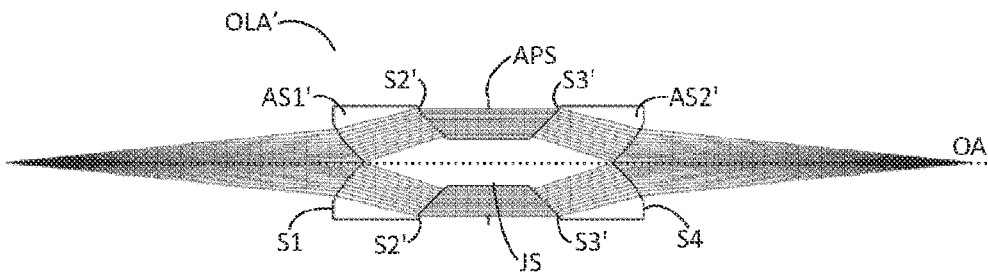
FIG. 11 depicts schematically an achromatic lens system comprising a monolithic lens element defining two achromatic aspherical axicon lenses in accordance with an alternative embodiment.

FIG. 11 depicts schematically such an achromatic optical relay arrangement comprising two achromatic aspherical axicon singlet lens elements formed as a monolithic lens component (e.g., formed together in a single material) in accordance with an embodiment. Referring back to FIG. 10, the collimated light beam propagating between the first achromatic aspherical axicon singlet lens element AS1 and the second achromatic aspherical axicon singlet lens element AS2 defines a cylindrical light-free joining section JS or channel centered on the optical axis OA in which the light is substantially absent. The diameter of such a cylindrical light-free channel may be determined by the designs of the two refractive surfaces of the achromatic aspherical axicon singlet lens element.

Therefore, the two achromatic aspherical axicon singlet lens elements can be joined near the axis without obstructing the light beam. The monolithic lens component shown in FIG. 11 adopts this concept. It should also be appreciated that the joining section does not need to be cylindrical, provided it does not impede the radiation.

With reference to FIG. 11, the monolithic lens component may be rotational symmetric about the optical axis OA. It may be manufactured directly in one single piece of glass or polymer which forms the two achromatic aspherical axicon singlet lens elements AS1', AS2'. The refractive surfaces S1, S2, S3, S4 may have substantially the same design and profile as those of the corresponding surfaces of the individual achromatic aspherical axicon singlet lens elements AS1, AS2 of FIG. 10. The joining section JS may extending along the optical axis between the two achromatic aspherical axicon singlet lens elements AS1', AS2' and have a diameter less than that of the cylindrical light-free channel determined by the surface designs of the achromatic aspherical axicon singlet lens element AS1' or AS2'. In such a manner, the joining section JS may be prevented from obstructing the light propagating between the two achromatic aspherical axicon singlet lens elements. The aperture stop APS may be a separate element e.g., comprising two halves joined together.

An advantage of such a configuration is that the two sets of refractive surfaces will always be mutually well aligned. This alignment may be further assured when the elements are for example direct diamond turned (e.g. in CaF2), or when the lenses are made using diamond turned molds. More specifically, the mold may comprise, for example, two halves which open along a plane through the optical axis to release the molded monolithic element.

The aperture stop APS may be made from at least two portions joined together because the entrance and exit surfaces of this optic have a larger diameter than the aperture stop. In some embodiments, suitable coatings (e.g., anti-reflective coatings) may be applied to all the refractive surfaces S1', S2', S3', S4' of the achromatic aspherical axicon singlet lens elements AS1', AS2' so as to enhance the optical performance of the optical relay arrangement.

The lens system of FIG. 11 may alternatively comprise two separately formed lenses AS1', AS2' which are subsequently joined (e.g., cemented or laser joining) together such that a good alignment between the two sets of refractive surfaces S1' and S2', S3' and S4' can be maintained in a long-term manner. Any optical coatings may be applied after the two singlet lenses are joined such that a high degree of homogeneity of coatings can be attained across all the surfaces of each achromatic aspherical axicon singlet lens element. As the join is in the on-transmitting channel, it should not be subject to the aforementioned drawbacks of conventional doublets.

Figure 12:
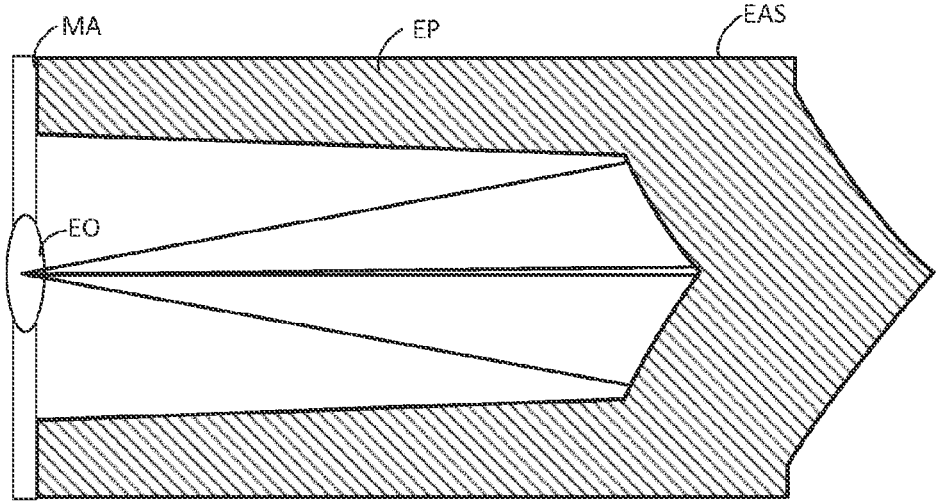
FIG. 12 depicts an extended aspherical axicon lens usable in the embodiment of FIG. 10 or 11.

FIG. 12 shows an extended achromatic aspherical axicon singlet lens element EAS which may form the basis of a lens system according to another embodiment. A circumferential region of the lens EAS of be extended along the optical axis OA such that the extended portion EP forms a barrel from which an external optical element EO can be mounted (e.g., via a mounting arrangement MA or otherwise. The external optical element EO may comprise, for example, an optical fiber, a laser diode or similar. Such a configuration may have an advantage of further improving the alignment between object, lens and image. One or both achromatic aspherical axicon singlet lens elements of the lens systems disclosed herein may comprise such an extended achromatic aspherical axicon singlet lens element EAS; e.g., the lens arrangement of FIG. 11 or 12 (e.g., in the latter case being formed as a monolithic element with another extended or non-extended achromatic aspherical axicon singlet lens element, or otherwise being joined together).

Lens relay systems (including those disclosed herein) may be employed in optical systems where multi wavelength ultrafast lasers are used in combination with an appropriate choice of optical material (e.g., sapphire, optical grade diamond, CAF$_2$ etc.). Using traditional achromats in such an environment is only possible with optical contact bonding, which restricts their curvature; additionally materials with high damage thresholds are limited. Therefore achromatization is not guaranteed for any wavelength. A unibody lens system comprising aspherical axicon singlets (either separate or combined as a monolithic entity), for example consisting of sapphire or optical grade diamond, may have superior thermal conductivity to any air spaced doublet or optical contact bonded glass. As such, it may be easier to cool the aspherical axicon singlets and avoid thermal lensing effects which may be caused by temperature dependent refractive index changes. As such, in an embodiment, an active athermalization arrangement is proposed with any of the lens systems disclosed herein to avoid thermal lensing; for example when used with multi wavelength ultrafast lasers and an appropriate choice of optical material (as described). Such an arrangement may also be useful when used with multi diode bars having a large diode-to-diode peak wavelength tolerance (e.g., one diode emits at 445 nm, another one 455 nm).

In an embodiment, a central portion of any of the lens elements of the lens systems disclosed herein may be doped with a phosphorus dopant (e.g., CE+2). Such aspherical axicon lens elements may be composed of a single crystal material suitable for doping and diamond turning; e.g., YAG or LuAg. The resultant converted radiation may be used, for example, for one or more of the following applications:

safety indicator for IR systems, irradiance/flux measurement for difficult to detect wavelengths when used in combination with a calibrated sensor, construction of a feedback loop for wavelength/spectral shape control. Some phosphor dopants have multiple narrow excitation spectra (e.g., Eu+) and may have different emission spectra for different excitation wavelengths. By analyzing the change in the emission spectrum with a calibrated spectrometer, it is possible to control power of two or more light sources such as lasers, and therefore modulate the output spectral shape.

Note that, the achromatic aspherical axicon singlet lens elements used in the optical relay arrangements such as the embodiments of FIGS. 10 and 11 should not be limited only to Schulz designs. Other types or designs of achromatic aspherical axicon singlet lens elements are equally applicable to construct an achromatic optical relay arrangement so long as they adopt the same principle as the above described embodiments: two or more substantially identical (at least in terms of the refractive surfaces) achromatic aspherical axicon singlet lens elements being arranged such that the lenses are symmetric about an aperture stop (i.e., the aperture stop is on the axis of symmetry). As such, aberrations of the optical relay arrangement are well corrected.

Also note that, the disclosed optical relay arrangements are not limited to lithographic applications (e.g., scatterometry based metrology applications), but they can also be used in any other beam-transferring applications, in particular where broadband radiation is involved and low optical aberrations (e.g., chromatic aberration) are desired.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Further embodiments according to the present invention are described in below numbered clauses:

1. A lens system, comprising:

a first aspherical axicon lens element comprising a first refractive surface and a second refractive surface;

a second aspherical axicon lens element comprising a third refractive surface similar to said second refractive surface and a fourth refractive surface similar to said first refractive surface, said first aspherical axicon lens element and second aspherical axicon lens being mutually oriented such that said second refractive surface and said third refractive surface are mutually facing; and an aperture stop located between the first aspherical axicon lens element and the second aspherical axicon lens element;

wherein the first aspherical axicon lens element and the second aspherical axicon lens element are configured to minimize chromatic aberration for at least a spectral range of radiation relayed by the lens system.

2. A lens system according to clause 1, wherein said first aspherical axicon lens element, second aspherical axicon lens and aperture stop share a common optical axis.

3. A lens system according to clause 2, wherein said first refractive surface, said second refractive surface, said third refractive surface, said fourth refractive surface and said aperture stop are arranged substantially symmetrically along said common optical axis, said aperture stop being located on the plane of symmetry.

4. A lens system according to clause 2 or 3, wherein the first aspherical axicon lens element and the second aspherical axicon lens element each comprise singlet lens elements.

5. A lens system according to clause 2, 3 or 4 wherein the first aspherical axicon lens element and the second aspherical axicon lens element are physically individual lens elements.

6. A lens system according to clause 5, further comprising an active lens alignment arrangement combining kinematic mounts for supporting and aligning the first aspherical axicon lens element, the second aspherical axicon lens element and the aperture stop, in combination with a feedback loop.

7. A lens system according to clause 2, 3 or 4, wherein the first aspherical axicon lens element and the second aspherical axicon lens element are joined together as a single optical element by a joining section, the joining section being located so as not to impede radiation relayed by the lens system.

8. A lens system according to clause 7, wherein said joining section is centered on or near said optical axis and comprises a smaller diameter than that of said first aspherical axicon lens element and said second aspherical axicon lens element.

9. A lens system according to clause 7 or 8, wherein said single optical element comprises a monolithic single optical element.

10. A lens system according to any preceding clause, wherein the aperture stop defines an aperture of fixed diameter configured to optimize optical performance of the lens system.

11. A lens system according to any preceding clause, wherein one or more of said first refractive surface, said second refractive surface, said third refractive surface and said fourth refractive surface comprises at least one optical coating.

12. A lens system according to in clause 11, wherein the at least one optical coating comprises an anti-reflective coating.

13. A lens system according to any preceding clause, wherein the first aspherical axicon lens element and the second aspherical axicon lens element are configured to minimize chromatic aberration such that chromatic focal shift over said spectral range varies by no more than 0.5 mm.

14. A lens system according to any preceding clause, wherein the first aspherical axicon lens element and the second aspherical axicon lens element are configured to minimize chromatic aberration such that chromatic focal shift over said spectral range varies by no more than 0.2 mm.

15. A lens system according to any preceding clause, wherein the spectral range comprises a range spanning more than 600 nm.

16. A lens system according to clause any preceding clause, wherein the spectral range comprises a range spanning more than 1000 nm.

17. A lens system according to any preceding clause, wherein the first and second refractive surfaces and the third and fourth refractive surfaces are configured according to the following criteria: for a given an object point, an image point and two refractive-index values and where corresponding two optical path lengths and one surface element are known, then all other discrete surface elements, are obtainable using y-n-u raytracing;

intermediate surface elements between any of said discrete surface elements are obtainable by means of interpolation and said intermediate surface elements and discrete surface elements connected together to determine said refracting surfaces; and the optical path lengths corresponding to the two reflective-index values are properly balanced and/or to ensure surface normal and curvatures of the refracting surfaces are continuous everywhere other than for an axial point.

18. A lens system according to any preceding clause, wherein the first aspherical axicon lens element is configured to collimate said radiation while the second aspherical axicon lens element is configured to focus said radiation.

19. A lens system according to any preceding clause, comprising one or both of:

a first extended portion which extends from a region of said first aspherical axicon lens element adjacent said first refractive surface; and a second extended portion which extends from a region of said second aspherical axicon lens element adjacent said fourth refractive surface.

20. A lens system according to clause 19, comprising one or more external optical elements, each of which being respectively supported, directly or indirectly, from said first extended portion and said second extended portion, so as to be properly aligned with the lens system.

21. A lens system according to any preceding clause, wherein a central portion of any one or more of said aspherical axicon lens elements is doped with a phosphorus dopant.

22. A lens system according to any preceding clause, further comprising an active athermalization arrangement for athermalization of the lens system.

23. A metrology device comprising an optical relay arrangement for relaying radiation to, from and/or within the metrology device, said optical relay arrangement comprising at least one lens system according to any preceding clause.

24. A metrology device according to clause 23, comprising a scatterometer metrology apparatus, a level sensor or an alignment sensor.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lens system, comprising:

a first aspherical axicon lens element comprising a first refractive surface and a second refractive surface;

a second aspherical axicon lens element comprising a third refractive surface similar to the second refractive surface and a fourth refractive surface similar to the first refractive surface, the first aspherical axicon lens element and second aspherical axicon lens being mutually oriented such that the second refractive surface and the third refractive surface are mutually facing; and an aperture stop located between the first aspherical axicon lens element and the second aspherical axicon lens element, wherein the first aspherical axicon lens element and the second aspherical axicon lens element are configured to minimize chromatic aberration for at least a spectral range of radiation relayed by the lens system.

2. The lens system as claimed in claim 1, wherein the first aspherical axicon lens element, second aspherical axicon lens element and aperture stop share a common optical axis.

3. The lens system as claimed in claim 2, wherein the first refractive surface, the second refractive surface, the third refractive surface, the fourth refractive surface and the aperture stop are arranged substantially symmetrically along the common optical axis, the aperture stop being located on the plane of symmetry.

4. The lens system as claimed in claim 2, wherein the first aspherical axicon lens element and the second aspherical axicon lens element each comprise singlet lens elements.

5. The lens system as claimed in claim 2, wherein the first aspherical axicon lens element and the second aspherical axicon lens element are physically individual lens elements.

6. The lens system as claimed in claim 2, wherein the first aspherical axicon lens element and the second aspherical axicon lens element are joined together as a single optical element by a joining section, the joining section being located so as not to impede radiation relayed by the lens system.

7. The lens system as claimed in claim 1, wherein the aperture stop defines an aperture of fixed diameter configured to optimize optical performance of the lens system.

8. The lens system as claimed in claim 1, wherein one or more selected from: the first refractive surface, the second refractive surface, the third refractive surface and/or the fourth refractive surface, comprises at least one optical coating.

9. The lens system as claimed in claim 1, wherein the first and second refractive surfaces and the third and fourth refractive surfaces are configured according to the following criteria:

for a given object point, image point and two refractive-index values and where corresponding two optical path lengths and one surface element are known, then all other discrete surface elements are obtainable using y-n-u raytracing;

intermediate surface elements between any of the discrete surface elements are obtainable by means of interpolation and the intermediate surface elements and discrete surface elements are connected together to determine the refracting surfaces; and the optical path lengths corresponding to the two refractive-index values are properly balanced and/or surface normal and curvatures of the refracting surfaces are continuous everywhere other than for an axial point.

10. The lens system as claimed in claim 1, wherein the first aspherical axicon lens element is configured to collimate the radiation while the second aspherical axicon lens element is configured to focus the radiation.

11. The lens system as claimed in claim 1, comprising one or both of:

a first extended portion which extends from a region of the first aspherical axicon lens element adjacent the first refractive surface; and/or a second extended portion which extends from a region of the second aspherical axicon lens element adjacent the fourth refractive surface.

12. The lens system as claimed in claim 1, wherein a central portion of any one or more of the aspherical axicon lens elements is doped with a phosphorus dopant.

13. The lens system as claimed in claim 1, further comprising an active athermalization arrangement for athermalization of the lens system.

14. A metrology device comprising an optical relay arrangement for relaying radiation to, from and/or within the metrology device, the optical relay arrangement comprising at least one lens system as claimed in claim 1.

15. The metrology device according to claim 14, comprising a scatterometer metrology apparatus, a level sensor or an alignment sensor.

16. The lens system according to claim 1, wherein the first aspherical axicon lens element and the second aspherical axicon lens element are configured to minimize chromatic aberration such that chromatic focal shift over the spectral range varies by no more than 0.5 mm.

17. The lens system according to claim 1, wherein the spectral range comprises a range spanning more than 600 nm.

18. The lens system according to claim 5, further comprising an active lens alignment arrangement combining kinematic mounts configured to support and align the first aspherical axicon lens element, the second aspherical axicon lens element and the aperture stop, in combination with a feedback loop.

19. The lens system according to claim 6, wherein the joining section is centered on or near the optical axis and comprises a smaller cross-sectional width than that of the first aspherical axicon lens element and the second aspherical axicon lens element.

20. The lens system according to claim 11, comprising one or more external optical elements, each of which being respectively supported, directly or indirectly, from the first extended portion or the second extended portion, so as to be properly aligned with the lens system.

* * * * *